(12) United States Patent
Shih

(10) Patent No.: US 7,205,569 B2
(45) Date of Patent: Apr. 17, 2007

(54) THIN FILM TRANSISTOR WITH MICROLENS STRUCTURES

(75) Inventor: Ming-Sung Shih, Dadu Township, Taichung County (TW)

(73) Assignee: AU Optronics Corp., Hsinchu (TW)

( * ) Notice: Subject to any disclaimer, the term of this patent is extended or adjusted under 35 U.S.C. 154(b) by 139 days.

(21) Appl. No.: 11/189,903

(22) Filed: Jul. 26, 2005

(65) Prior Publication Data
US 2006/0163575 A1    Jul. 27, 2006

(30) Foreign Application Priority Data
Jan. 25, 2005    (TW) .............................. 94102108 A

(51) Int. Cl.
*H01L 33/006*    (2006.01)
*H01L 51/2022*    (2006.01)

(52) U.S. Cl. ..................... 257/59; 72/432; 72/E51.006; 72/E33.068; 438/29; 438/30

(58) Field of Classification Search ..................... None
See application file for complete search history.

(56) References Cited

U.S. PATENT DOCUMENTS

| | | | | |
|---|---|---|---|---|
| 5,463,216 A | * | 10/1995 | Van Berkel | 250/208.1 |
| 5,574,293 A | * | 11/1996 | Arai et al. | 438/59 |
| 5,811,322 A | * | 9/1998 | Robinson | 438/92 |
| 6,078,070 A | * | 6/2000 | Robinson | 257/280 |
| 6,171,885 B1 | | 1/2001 | Fan et al. | |
| 6,744,068 B2 | * | 6/2004 | Fossum et al. | 257/59 |
| 7,132,694 B2 | * | 11/2006 | Mochizuki | 257/91 |
| 7,154,654 B2 | * | 12/2006 | Kimura | 359/237 |
| 2002/0021402 A1 | * | 2/2002 | Hirabayashi et al. | 349/187 |
| 2002/0030768 A1 | * | 3/2002 | Wu | 349/42 |
| 2004/0036834 A1 | * | 2/2004 | Ohnishi et al. | 349/177 |
| 2004/0142568 A1 | | 7/2004 | Jung | |
| 2004/0233503 A1 | * | 11/2004 | Kimura | 359/275 |
| 2006/0187379 A1 | * | 8/2006 | Yamanaka et al. | 349/95 |

FOREIGN PATENT DOCUMENTS

| | | |
|---|---|---|
| CN | 1451205 | 10/2003 |
| WO | WO0145283 | 6/2001 |

OTHER PUBLICATIONS

China Office Action mailed Nov. 10, 2006.

* cited by examiner

*Primary Examiner*—Evan Pert
*Assistant Examiner*—Victor A. Mandala, Jr.
(74) *Attorney, Agent, or Firm*—Thomas, Kayden, Horstemeyer & Risley

(57) ABSTRACT

A thin film transistor with a microlens. A metal gate is formed on a substrate. A gate dielectric covers the metal gate. A semiconductor layer is formed on the gate dielectric. Source/drain metal layers respectively overlap ends of the top surface of the semiconductor layer such that the semiconductor layer between the source/drain metal layers is exposed. The microlens is formed on the exposed top surface of the semiconductor layer.

11 Claims, 4 Drawing Sheets

THIN FILM TRANSISTOR WITH MICROLENS STRUCTURES

BACKGROUND

The invention relates to a thin film transistor and, in particular, to a thin film transistor with a microlens.

Thin film transistors can act as image sensors capturing image or light signals in addition to driving devices on a liquid crystal display panel. Image sensors are an input interface and applications thereof include copiers, input for light pens or laser pointers, camera, palm or fingerprint recognition, interactive television, automatic light compensation, X-ray medical imaging or web-cams.

A pixel array of a conventional thin film transistor liquid crystal display (TFT-LCD) is shown in FIG. 1. Amorphous silicon thin film transistors (TFTs) in the pixel array are provided with a back channel etched structure (BCE structure), as shown in FIG. 2. Since amorphous silicon is a very good light absorbing material, especially in the range of visible light, the back channel etched thin film transistor is used as an image sensor for image capture. Fabrication of a TFT sensor, however, is constrained by fabrication process of an amorphous silicon thin film transistor display (α-Si TFT-LCD). Thus, the ratio of photocurrent to dark current of a TFT sensor is around or lower than $10^3$. When applied as an image sensor, conventional TFTs present drawbacks as follows. When contrast ratio is low, images of full color or better quality cannot be captured, mistakes are often made when the conventional TFT is used in palm or fingerprint recognition, the TFT cannot normally function in all circumstances when used as an input for an interactive television or monitor, when the contrast ratio is low, it is very complicated to design a suitable backend sense amplifier, and, since photocurrent is smaller, the response time is longer.

SUMMARY

Embodiments of the invention provide a TFT sensor with a microlens. Fabrication of the TFT sensor is compatible with a process for fabricating a high contrast ratio or reflective thin film transistor liquid crystal display. The microlens structure is used to focus light and increase photocurrent of the TFT sensor.

An embodiment of a thin film transistor with a microlens comprises a metal gate, a gate dielectric, a semiconductor layer, source/drain metal layers and a microlens. The metal gate is formed on a substrate. The gate dielectric covers the metal gate. The semiconductor layer is formed on the gate dielectric. The source/drain metal layers respectively overlap ends of the top surface of the semiconductor layer such that the semiconductor layer between the source/drain metal layers is exposed. The microlens is formed on the exposed top surface of the semiconductor layer.

An embodiment of a method of fabricating a thin film transistor with a microlens comprises forming a thin film transistor on a substrate, the thin film transistor having a semiconductor layer, with two ends covered by source/drain metal layers; and forming a microlens on the semiconductor layer not covered by the source/drain metal layers.

Embodiments of a thin film transistor with a microlens according to the invention provide the following advantages. Fabrication of the thin film transistor is compatible with a prevailing fabrication process of an amorphous silicon thin film transistor display, no additional cost is required, image capture of high quality is enabled, various microlenses of different shapes can be formed through photolithography adjustment and mask design, and, since photocurrent is increased, response time is significantly reduced.

DETAILED DESCRIPTION

Figure 1:
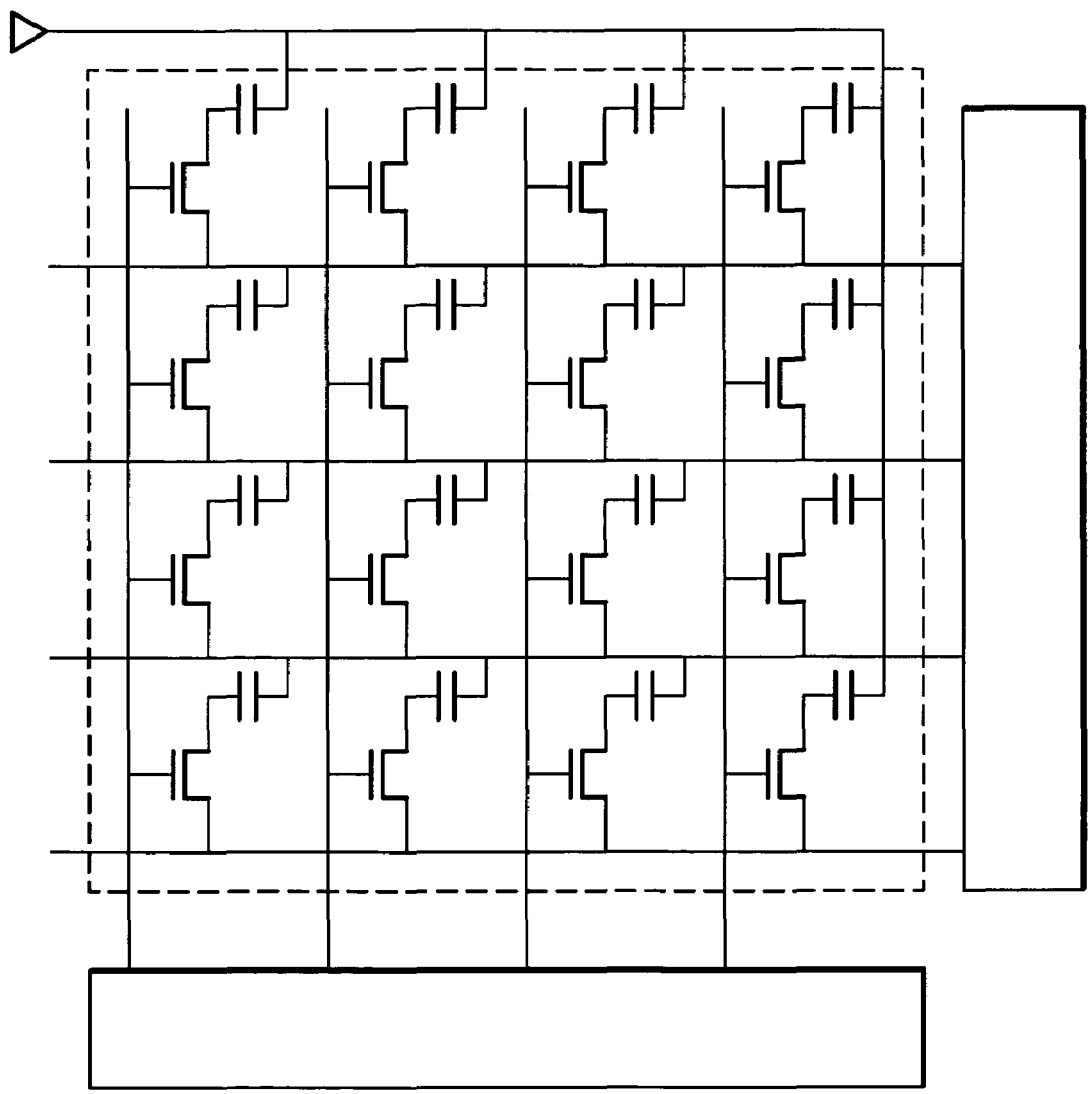
FIG. 1 shows a pixel array of a conventional thin film transistor liquid crystal display (TFT-LCD).
Figure 2:
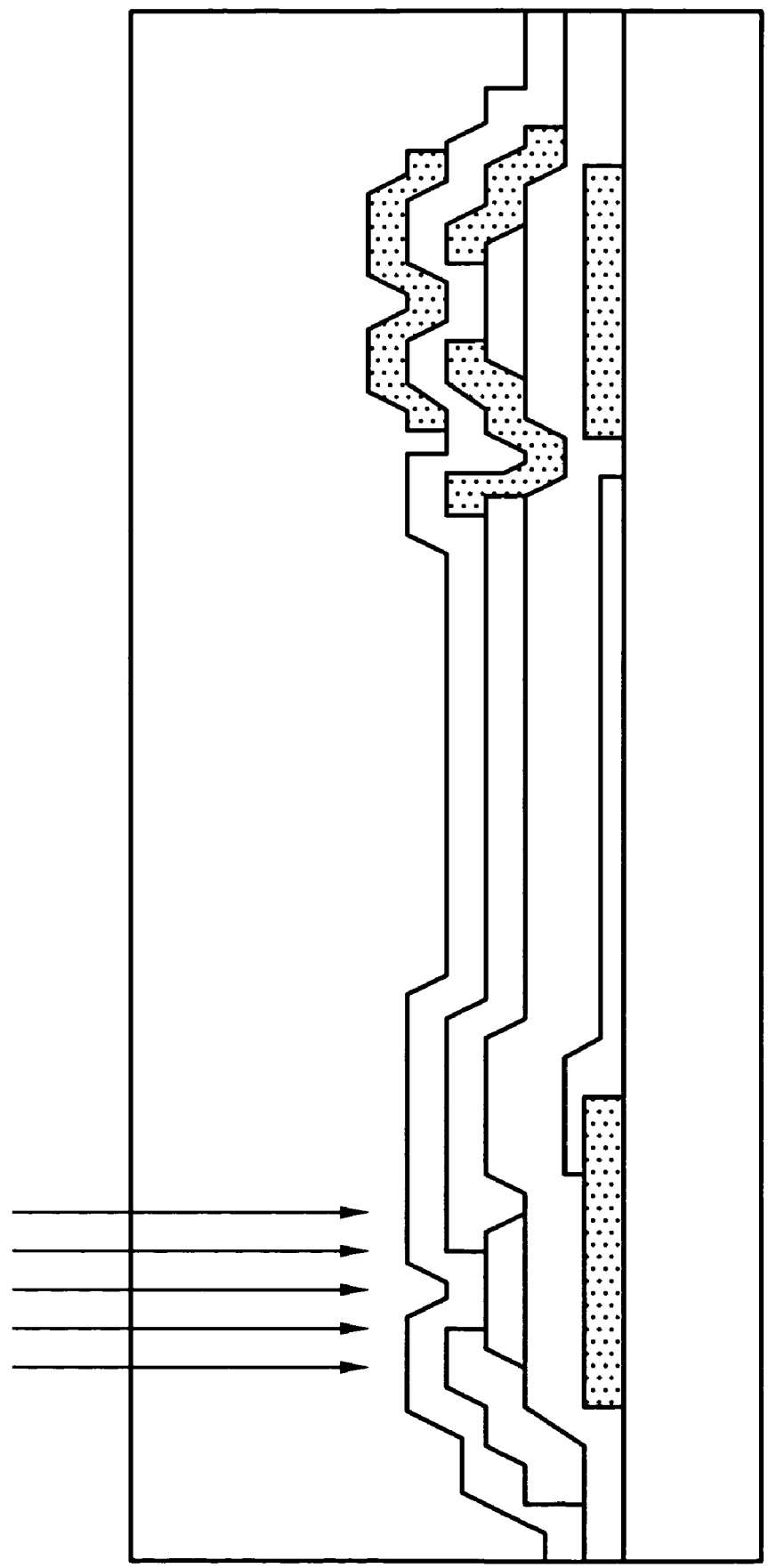
FIG. 2 shows a cross section of a conventional back channel etched thin film transistor.
Figure 3:
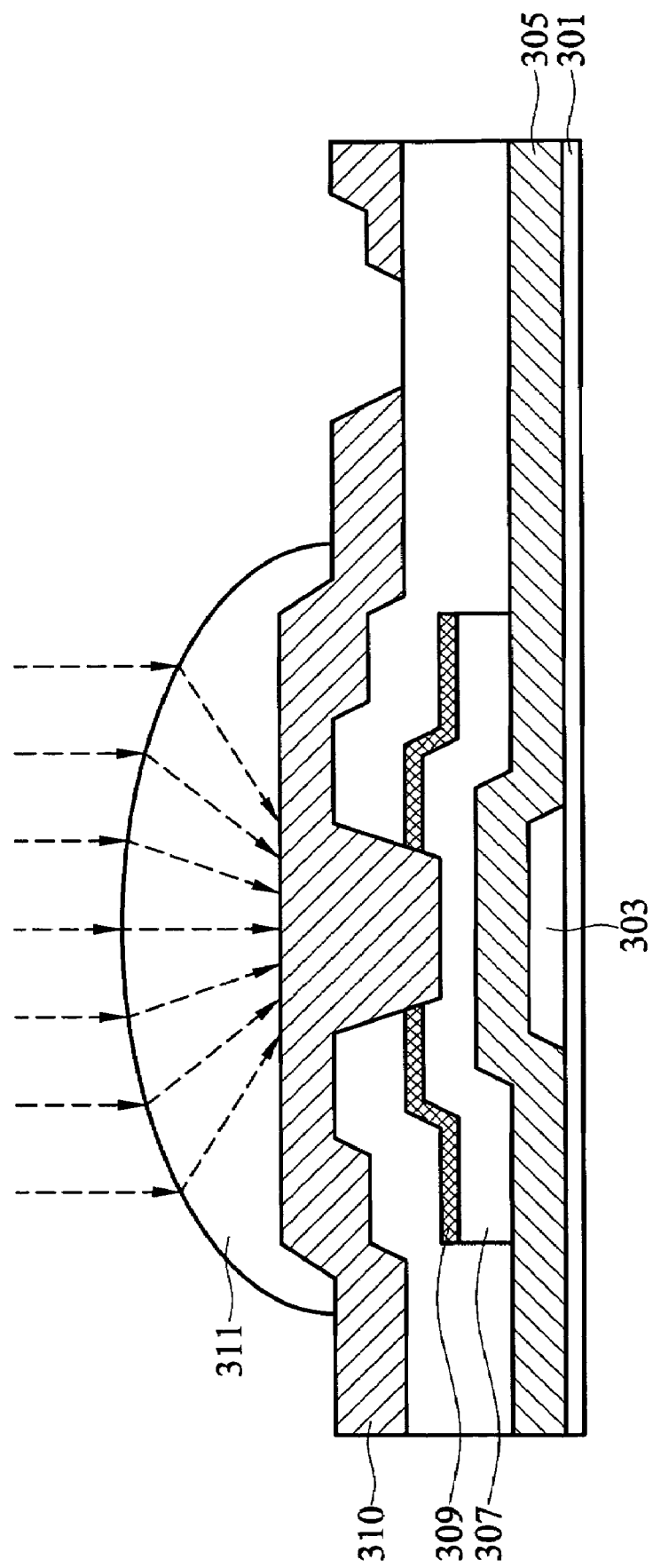
FIG. 3 shows a thin film transistor with a microlens according to an embodiment of the invention.

FIG. 3 shows a thin film transistor with a microlens according to an embodiment of the invention. The thin film transistor with a microlens comprises a metal gate 303, a gate dielectric 305, a semiconductor layer 307, source/drain metal layers 309 and a microlens 311. The metal gate 303 is formed on a substrate 301. The gate dielectric 305 covers the metal gate 303. The semiconductor layer 307 is formed on the gate dielectric 305. The source/drain metal layers 309 respectively overlap ends of the top surface of the semiconductor layer 307 such that the semiconductor layer 307 between the source/drain metal layers 309 is exposed. The microlens 311 is formed on the exposed top surface of the semiconductor layer 307. Preferably, the material of the semiconductor layer 307 is amorphous silicon, crystalline silicon or poly-silicon. In this embodiment, the material of the semiconductor layer 307 is amorphous silicon.

As shown in FIG. 3, a passivation layer is sandwiched between the microlens 311 and the semiconductor layer 307. Preferably, the microlens is a photoresist. The microlens 311 can be formed by spin coating or slit coating a photoresist on the thin film transistor. After soft baking, exposure, development and bleach, the light transmission of the microlens 311 is over 95%. Such a microlens provides superior focus. Thus, the photocurrent of the amorphous silicon TFT sensor is improved significantly.

The microlens 311 can be an organic photoresist. The photoresist, which becomes a transparent lens, like acrylic resin, after standard lithography, UV bleaching, and oven curing, is applicable to the invention. In some embodiments of the invention, photoresists PC 403B, PC 411, JS100, and JS200, made by a Japanese company JSR, are applicable.

In one embodiment, as shown in FIG. 3, for example, when the thin film transistor is used only as an image sensor, the microlens 311 can directly contact the semiconductor layer 307, such that the passivation layer 310 is not required. However, if the thin film transistor is used as a driving device or storage capacitor, the passivation layer 310 can be formed between the microlens 311 and the semiconductor layer 307.

Figure 4:
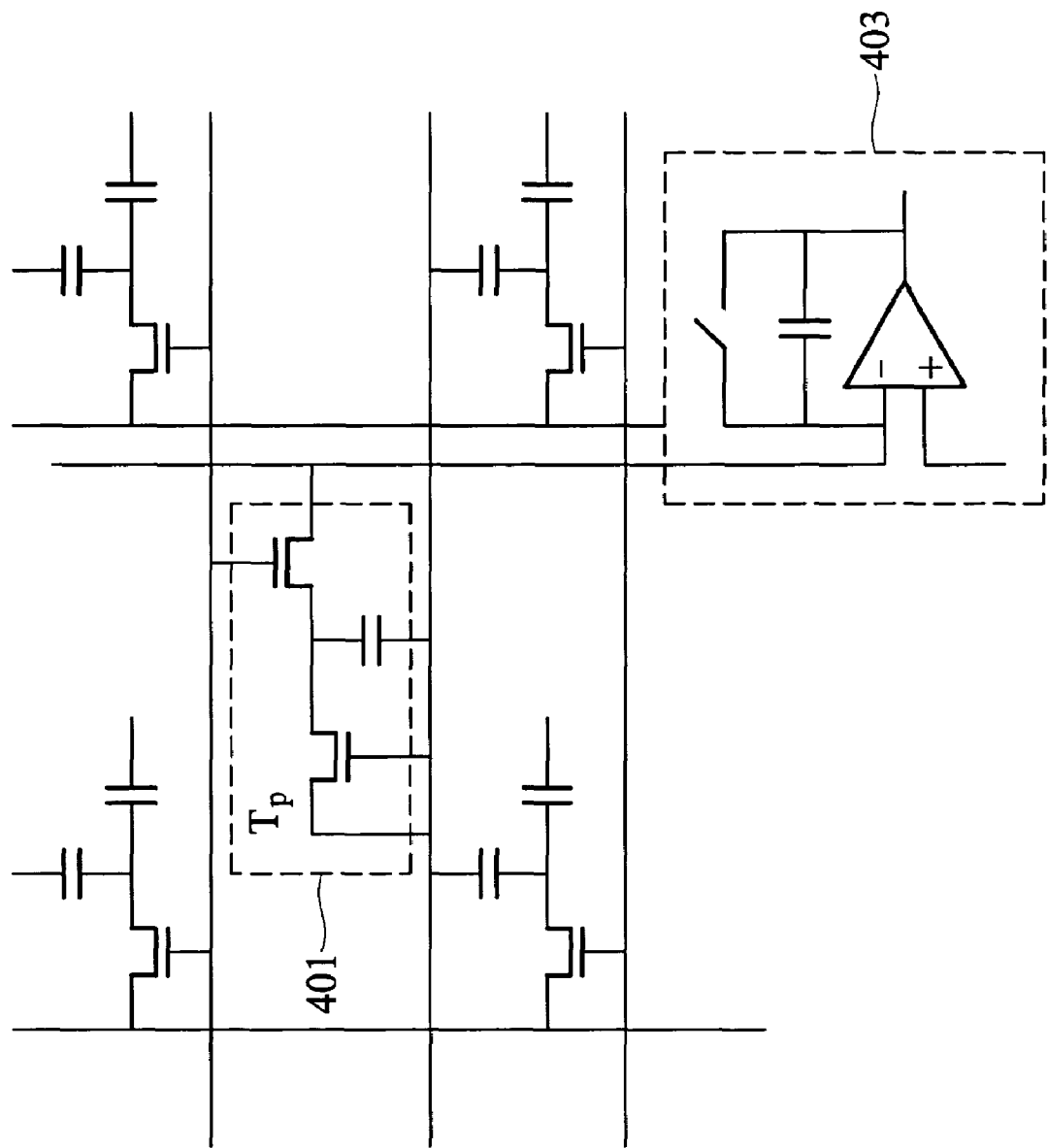
FIG. 4 shows a schematic diagram of a pixel array comprising the thin film transistor shown in FIG. 3.

Also provided is a thin film transistor liquid crystal display. The TFT-LCD comprises a pixel array. As shown in FIG. 4, the pixel array comprises a front-end sensing circuit 410 and a back-end amplifier circuit 403. The front-end sensing circuit 410 comprises the aforementioned thin film transistor $T_p$ with a microlens. In this embodiment, the front-end sensing circuit 401 can be disposed in the blue pixel such that the effects of aperture ratio loss are minimized. Although the aperture ratio is lowered 3 to 5%, the value and function of the TFT-LCD is significantly improved.

The invention also provides an embodiment of a method of fabricating a thin film transistor with a microlens. A thin film transistor if formed on a glass substrate 301, as shown in FIG. 3. The thin film transistor comprises a semiconductor layer 307, with ends covered by source/drain metal layers 309. The semiconductor layer 307 between the source/drain metal layers 309 is exposed. Next, a microlens 311 is formed on the exposed semiconductor layer 307. Preferably, the semiconductor layer 307 is amorphous silicon, crystalline silicon or poly-silicon. In this embodiment, the semiconductor layer is amorphous silicon.

Furthermore, the method of forming the thin film transistor with a microlens comprises forming a passivation layer 310 between the microlens 311 and the semiconductor layer 307. Preferably, the microlens 311 is a photoresist. Formation of the microlens 311 comprises spin coating or slit coating a photoresist on the thin film transistor and controlling the shape of the microlens through lithography. The lithography process comprises soft baking, exposure, development, bleaching or combinations thereof.

Embodiments of the invention provide a TFT sensor with a microlens compatible with a process for fabricating a high contrast ratio or reflective thin film transistor liquid crystal display. The microlens structure focuses light and increases photocurrent of the TFT sensor.

While the invention has been described by way of example and in terms of preferred embodiment, it is to be understood that the invention is not limited thereto. To the contrary, it is intended to cover various modifications and the advantages would be apparent to those skilled in the art. Therefore, the scope of the appended claims should be accorded the broadest interpretation so as to encompass all such modifications.

What is claimed is:

1. A thin film transistor comprising:
   a metal gate formed on a substrate;
   a gate dielectric over the metal gate;
   a semiconductor layer on the gate dielectric;
   source/drain metal layers respectively covering ends of the top surface of the semiconductor layer such that the semiconductor layer between the source/drain metal layers is exposed; and
   a microlens on the exposed semiconductor layer.

2. The thin film transistor as claimed in claim 1, wherein a passivation layer is sandwiched between the microlens and the semiconductor layer.

3. The thin film transistor as claimed in claim 1, wherein the semiconductor layer comprises silicon.

4. The thin film transistor as claimed in claim 1, wherein the microlens is a photoresist.

5. A thin film transistor liquid crystal display comprising the thin film transistor as claimed in claim 1.

6. A method of forming a thin film transistor with a microlens comprising:
   forming a thin film transistor on a substrate, the thin film transistor having a semiconductor layer, with ends covered by source/drain metal layers; and
   forming a microlens on the semiconductor layer not covered by the source/drain metal layers.

7. The method as claimed in claim 6, further comprising forming a passivation layer between the microlens and the semiconductor layer.

8. The method as claimed in claim 6, wherein the semiconductor layer comprises silicon.

9. The method as claimed in claim 6, wherein the microlens is a photoresist.

10. The method as claimed in claim 9, wherein the step of forming a microlens comprises coating the photoresist on the thin film transistor.

11. The method as claimed in claim 6, wherein the step of forming a microlens comprises controlling the shape of the microlens through lithography or mask design.

* * * * *